(12) United States Patent
Hai et al.

(10) Patent No.: US 11,611,059 B2
(45) Date of Patent: Mar. 21, 2023

(54) DISPLAY APPARATUS

(71) Applicant: BOE Technology Group Co., Ltd., Beijing (CN)

(72) Inventors: Xiaoquan Hai, Beijing (CN); Lei Wang, Beijing (CN); Yingzi Wang, Beijing (CN); Xuan Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/357,154

(22) Filed: Jun. 24, 2021

(65) Prior Publication Data

US 2022/0149335 A1    May 12, 2022

(30) Foreign Application Priority Data

Nov. 6, 2020   (CN) .......................... 202011230992.9

(51) Int. Cl.
| | |
|---|---|
| *H01L 27/32* | (2006.01) |
| *H01L 51/52* | (2006.01) |
| *H01L 25/18* | (2023.01) |
| *G06V 40/13* | (2022.01) |
| *G06V 10/145* | (2022.01) |

(52) U.S. Cl.
CPC ...... *H01L 51/5284* (2013.01); *G06V 40/1318* (2022.01); *H01L 25/18* (2013.01); *H01L 27/322* (2013.01); *H01L 27/3246* (2013.01); *H01L 27/3258* (2013.01); *G06V 10/145* (2022.01)

(58) Field of Classification Search
CPC ... H01L 51/5284; H01L 25/18; H01L 27/322; H01L 27/3246; H01L 27/3258; G06V 40/1318; G06V 10/145
See application file for complete search history.

(56) References Cited

U.S. PATENT DOCUMENTS

2020/0395433 A1*  12/2020  Sung .................. G06V 40/1318

\* cited by examiner

*Primary Examiner* — Abdul-Samad A Adediran
(74) *Attorney, Agent, or Firm* — Workman Nydegger

(57) ABSTRACT

The present disclosure provides a display apparatus including: a display module with a plurality of color filters and a black matrix with a plurality of first openings and a plurality of second openings, and the plurality of color filters are arranged in the plurality of first openings in a one-to-one correspondence; a fingerprint recognition circuit, on a side of the display module away from a display surface of the display module and including a plurality of fingerprint recognition elements; and a collimating structure, on an incident side of the fingerprint recognition circuit and including at least two light shading layers, wherein each of the light shading layers has a plurality of light transmitting holes, and one of the light shading layers is multiplexed as the black matrix.

20 Claims, 8 Drawing Sheets

DISPLAY APPARATUS

CROSS REFERENCE TO RELATED APPLICATIONS

The present disclosure claims priority to Chinese Patent Application No. 202011230992.9 filed with the China National Intellectual Property Administration on Nov. 6, 2020, the entire contents of which are incorporated herein by its reference.

FIELD

The present disclosure relates to the field of display technology, in particular to a display apparatus.

BACKGROUND

With high-speed development of an information industry, a biological recognition technology is applied more and more widely, in particular, fingerprints of different users differ, which facilitates identity verification of the users, so that a fingerprint recognition technology has been widely applied to various fields such as a mobile terminal, a smart home, etc. and guarantees security of user information.

SUMMARY

An embodiment of the present disclosure provides a display apparatus, including:

a display module, including: a plurality of color filters and a black matrix; wherein the black matrix is provided with a plurality of first openings and a plurality of second openings, and the plurality of color filters are arranged in the plurality of first openings in a one-to-one correspondence;

a fingerprint recognition circuit, on a side of the display module away from a display surface of the display module and including a plurality of fingerprint recognition elements, wherein an orthographic projection of each of the plurality of fingerprint recognition elements on a plane where the display module is located at least completely covers an orthographic projection of one of the plurality of second openings and does not overlap with orthographic projections of the plurality of first openings; and a collimating structure, on an incident side of the fingerprint recognition circuit and including at least two light shading layers, wherein each of the light shading layers has a plurality of light transmitting holes, the light transmitting holes in the respective light shading layers are correspond to each other one by one, orthographic projections of the light transmitting holes in one of the light shading layers on the plane where the display module is located at least overlap partially with orthographic projections of the corresponding light transmitting holes in another of the light shading layers on the plane where the display module, respectively, and one of the light shading layers is multiplexed as the black matrix.

In some embodiments, in the display apparatus provided by the embodiment of the present disclosure, the display module further includes: a plurality of anodes, and a flat layer on a side of a layer with the plurality of anodes away from the black matrix; and the collimating structure includes: a first light shading layer with a plurality of first light transmitting holes, a second light shading layer with a plurality of second light transmitting holes, and a third light shading layer with a plurality of third light transmitting holes; wherein the first light shading layer is on a side of the fingerprint recognition circuit facing the display module, the second light shading layer is multiplexed as the flat layer, and the third light shading layer is multiplexed as the black matrix.

In some embodiments, in the display apparatus provided by the embodiment of the present disclosure, the display module further includes: a plurality of anodes, and a pixel defining layer on a side of a layer with the plurality of anodes facing the black matrix; and the collimating structure includes: a first light shading layer with a plurality of first light transmitting holes, a second light shading layer with a plurality of second light transmitting holes, and a third light shading layer with a plurality of third light transmitting holes; wherein the first light shading layer is on a side of the fingerprint recognition circuit facing the display module, the second light shading layer is multiplexed as the pixel defining layer, and the third light shading layer is multiplexed as the black matrix.

In some embodiments, in the display apparatus provided by the embodiment of the present disclosure, the display module further includes: a plurality of anodes, a flat layer on a side of a layer with the plurality of anodes away from the black matrix, and an encapsulation layer between the plurality of anodes and the black matrix; and the collimating structure includes: a first light shading layer with a plurality of first light transmitting holes, a second light shading layer with a plurality of second light transmitting holes, and a third light shading layer with a plurality of third light transmitting holes; wherein the first light shading layer is multiplexed as the flat layer, the second light shading layer is on a side of the encapsulation layer facing the black matrix, and the third light shading layer is multiplexed as the black matrix.

In some embodiments, in the display apparatus provided by the embodiment of the present disclosure, the display module further includes: a plurality of anodes, a pixel defining layer on a side of a layer with the plurality of the anodes facing the black matrix, and an encapsulation layer between the pixel defining layer and the black matrix; and the collimating structure includes: a first light shading layer with a plurality of first light transmitting holes, a second light shading layer with a plurality of second light transmitting holes, and a third light shading layer with a plurality of third light transmitting holes; wherein the first light shading layer is multiplexed as the pixel defining layer, the second light shading layer is on a side of the encapsulation layer facing the black matrix, and the third light shading layer is multiplexed as the black matrix.

In some embodiments, in the display apparatus provided by the embodiment of the present disclosure, the display module further includes: a plurality of anodes, a flat layer on a side of a layer with the plurality of anodes away from the black matrix, and a pixel defining layer on a side of the layer with the plurality of anodes facing the black matrix; and the collimating structure includes: a first light shading layer with a plurality of first light transmitting holes, a second light shading layer with a plurality of second light transmitting holes, and a third light shading layer with a plurality of third light transmitting holes; wherein the first light shading layer is multiplexed as the flat layer, the second light shading layer is multiplexed as the pixel defining layer, and the third light shading layer is multiplexed as the black matrix.

In some embodiments, in the display apparatus provided by the embodiment of the present disclosure, centers of orthographic projections of the first light transmitting holes, the second light transmitting holes and the third light transmitting holes in one-to-one correspondence on the plane where the display module is located coincide with each other.

In some embodiments, in the display apparatus provided by the embodiment of the present disclosure, distances between centers of any two adjacent first light transmitting holes of the plurality of first light transmitting holes are the same.

In some embodiments, in the display apparatus provided by the embodiment of the present application, a bore diameter of the first light transmitting holes is equal to that of the third light transmitting holes.

In some embodiments, in the display apparatus provided by the embodiment of the present disclosure, the bore diameter $d_1$ of the first light transmitting holes and a bore diameter $d_2$ of the second light transmitting holes meet the following relation: $d_2/d_1=h_1/(h_1+h_2)$, wherein $h_1$ is a distance between the second light shading layer and the third light shading layer, and $h_2$ is a distance between the first light shading layer and the second light shading layer.

In some embodiments, in the display apparatus provided by the embodiment of the present disclosure, a distance P between centers of any two adjacent first light transmitting holes, a bore diameter D of the first openings, $d_1$, $d_2$, $h_1$ and $h_2$ meet the following relation: $(P-D-d_1)/(2d_1) \geq (h_1/h_2) \geq (P+D+3d_1+d_2)/(P-d_1+d_2)$.

In some embodiments, in the display apparatus provided by the embodiment of the present disclosure, a value of P is within a range of 1 μm to 80 μm, a value of D is within a range of 10 μm to 40 μm, a value of $d_1$ is within a range of 4 μm to 15 μm, a value of $d_2$ is within a range of 2 μm to 10 μm, a value of $h_1$ is within a range of 1 μm to 30 μm, and a value of $h_2$ is within a range of 2 μm to 100 μm.

In some embodiments, in the display apparatus provided by the embodiment of the present disclosure, a collimating light collection angle θ determined by the first light shading layer and the third light shading layer meets the following relation: $\tan \theta = d_1/(h_1+h_2)$.

DETAILED DESCRIPTION OF THE EMBODIMENTS

Figure 1:
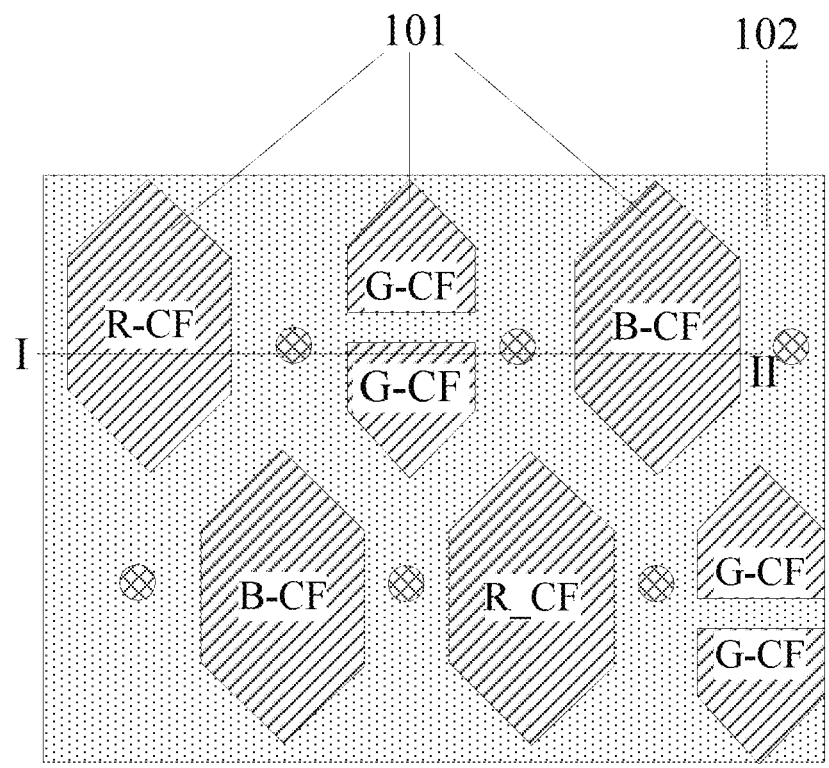
FIG. 1 is a schematic structural diagram of a display apparatus provided by an embodiment of the present disclosure.

In order to make objectives, technical solutions and advantages of embodiments of the present disclosure clearer, the technical solutions of the embodiments of the present disclosure will be clearly and fully described in combination with the accompanying drawings of the embodiments of the present disclosure. It should be noted that sizes and shapes of all figures in the drawings do not reflect a true scale and are only intended to illustrate contents of the present disclosure. Same or similar reference numbers denote same or similar elements or elements with same or similar function all the time. Apparently, the described embodiments are only some, not all of the embodiments of the present disclosure. Based on the described embodiments of the present disclosure, all other embodiments obtained by those ordinarily skilled in the art without creative work belong to the protection scope of the present disclosure.

Unless otherwise defined, technical or scientific terms used herein should be understood commonly by those ordinarily skilled in the art of the present disclosure. "First", "second" and other similar words used in the description and claims do not denote any sequence, quantity or significance, but are only used for distinguishing different components. "Include", "contain" and other similar words mean that elements or items preceding the word cover elements or items and their equivalents listed after the word without excluding other elements or items. "Inner", "outer", "up", "down" and the like are only used for denoting a relative position relation, and when an absolute position of a described object changes, the relative position relation may change correspondingly.

Optical fingerprint recognition is one means of realizing fingerprint recognition. A principle of optical fingerprint recognition is as follows: when a finger is put above a display product, light rays emitted by a light source contained in the display product irradiate positions of valleys and ridges of the fingerprint, and then are reflected by the valleys and the ridges of the fingerprint to enter an optical fingerprint recognition element contained in the display product. As light intensities reflected by the positions of the valleys and the ridges differ, the fingerprint recognition element generates different electrical signals according to the different reflected light intensities, and the fingerprint recognition is realized.

A display apparatus with a fingerprint recognition function in the related art includes a display module and a fingerprint recognition circuit attached through an optical adhesive; wherein the display module includes a base substrate, a pixel driving circuit, a light-emitting device, an encapsulation layer, a black matrix, a color filter, a polarizer and a protection cover plate which are arranged from bottom to top. During specific implementation, light rays emitted by the light-emitting device are reflected by a fingerprint and then irradiate the fingerprint recognition circuit in sequence through the display module and the optical adhesive, thereby achieving the fingerprint recognition. However, with ultra-thinning of the display module, an area of a fingerprint image obtained by the above fingerprint recognition solution becomes smaller, consequently time for splicing a fingerprint image with large-area is prolonged, an edge of the fingerprint image is vulnerable to interference of strong light, then the image is blurry, and a splicing effect is poor. Thus, design of a solution capable of achieving large-area fingerprint recognition is a development trend in the future.

On that account, an embodiment of the present disclosure provides an organic light-emitting display panel, as shown in FIGS. 1 to 7, including:

a display module 1, provided with a plurality of color filters 101 and a black matrix 102; wherein the black matrix 102 is provided with a plurality of first openings and a plurality of second openings, and the plurality of color filters 101 are provided in the plurality of first openings in a one-to-one correspondence;

a fingerprint recognition circuit 2, on a side of the display module away from a display surface of the display module 1; wherein the fingerprint recognition circuit 2 includes a plurality of fingerprint recognition elements 201, and an orthographic projection of each of the fingerprint recognition elements 201 on a plane where the display module 1 is located at least completely covers an orthographic projection of one of the second openings and does not overlap with orthographic projections of the plurality of first openings; and a collimating structure 3, on an incident side of the fingerprint recognition circuit 2; wherein the collimating structure includes at least two light shading layers (e.g., a first light shading layer 301, a second light shading layer 302 and a third light shading layer 303), wherein each of the light shading layers is provided with a plurality of light transmitting holes, the light transmitting holes in the respective light shading layers are correspond to each other one by one, orthographic projections of the light transmitting holes in one of the light shading layers on the plane where the display module 1 is located at least overlap partially with orthographic projections of the corresponding light transmitting holes in another of the light shading layers on the plane where the display module 1, respectively, and one of the light shading layers (e.g., the third light shading layer 303) is multiplexed as the black matrix 102.

In the display apparatus provided by the embodiment of the present disclosure, during fingerprint recognition, when a finger F touches the display surface of the display module 1, the corresponding light transmitting holes of the respective light shading layers (e.g., the first light shading layer 301, the second light shading layer 302 and the third light shading layer 303) may screen out small-angle light rays in an approximately collimating mode and make the small-angle light rays reach the fingerprint recognition elements 201 below, the fingerprint recognition elements 201 may detect the intensities of taken-out light rays, energies of downward diffuse reflection light rays of valleys and ridges differ, the light intensities detected by the plurality of fingerprint recognition elements 201 differ, thus fingerprint information is obtained, and large-area fingerprint recognition is achieved. Besides, one of the light shading layers (e.g., the third light shading layer 303) is multiplexed as the black matrix 102, a fabrication process of one light shading layer may be omitted, a fabrication process flow is simplified, the production cost is reduced, and the production efficiency is improved.

It should be noted that in the collimating structure 3 provided by the embodiment of the present disclosure, the light transmitting holes in the respective light shading layers are the same in number and position and are in a one-to-one correspondence. During fabrication, orthographic projections of the light transmitting holes in the same position in the respective light shading layers on the display module 1 overlap with each other as completely as possible, however, according to alignment errors of an actual fabrication process, a certain deviation exists between the light transmitting holes in the same position in the respective light shading layers, and complete overlapping may not be guaranteed, that is, partial overlapping may exist.

Areas where the orthographic projections of the light transmitting holes in the same position in the respective light shading layers on the display module 1 completely overlap constitute sleeve hole structures which play a role in collimating light rays entering the position at various angles, thus light rays which form an angle (a small angle) in a certain range relative to a normal perpendicular to a surface of the collimating structure 3 may pass through the sleeve hole structures, and light rays at an angle (a large angle) exceeding the range may be blocked. In some embodiments, a difference between a minimum angle and a maximum angle by which the light rays may pass is a light collection angle θ. Besides, when the present disclosure has more than two light shading layers, the light collection angle θ of the collimating structure 3 may be defined through the top light shading layer and the bottom light shading layer, the middle light shading layer may be used for blocking light ray crosstalk between adjacent through holes, and the accuracy of recognized fingerprint information is improved.

Figure 2:
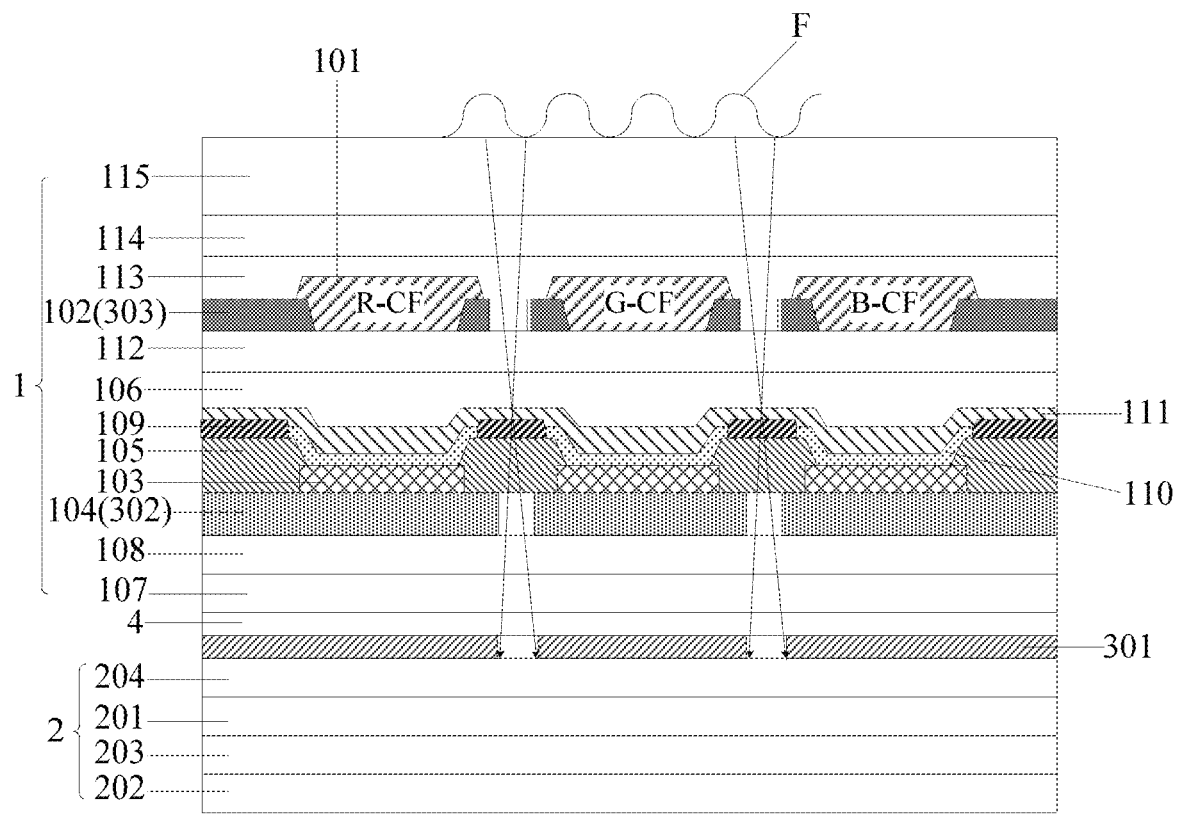
FIG. 2 is a schematic diagram of a sectional structure along a I-II line of FIG. 1.
Figure 3:
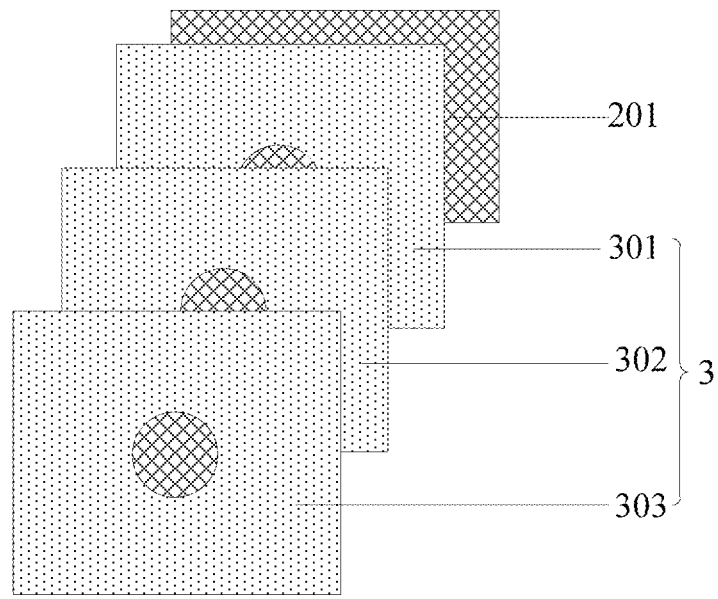
FIG. 3 is a drawing of a corresponding relation of light transmitting holes of a collimating structure and fingerprint recognition elements in FIG. 1.
Figure 4:
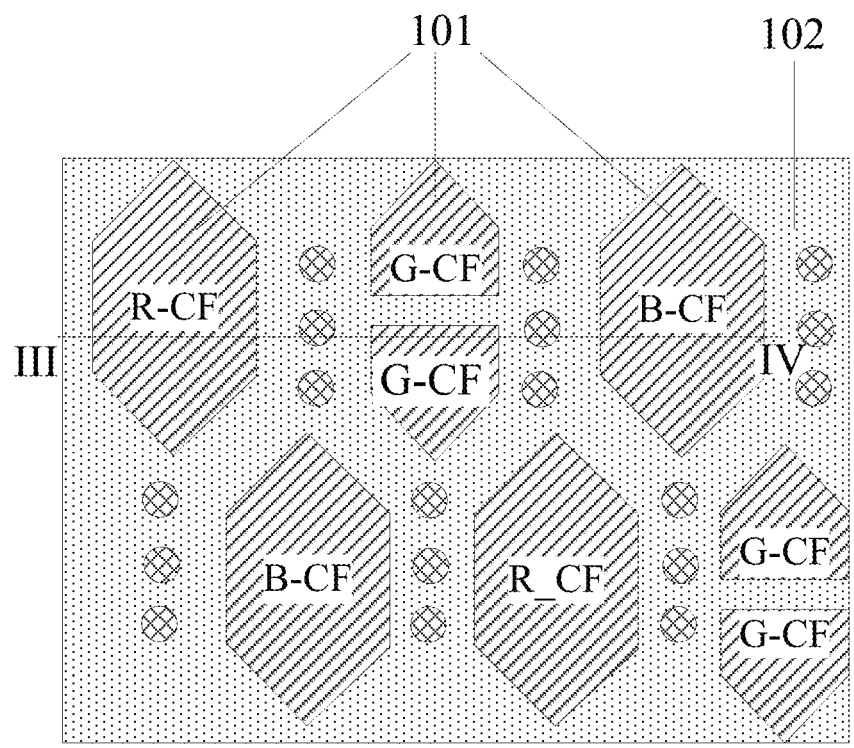
FIG. 4 is a schematic structural diagram of a display apparatus provided by an embodiment of the present disclosure.
Figure 5:
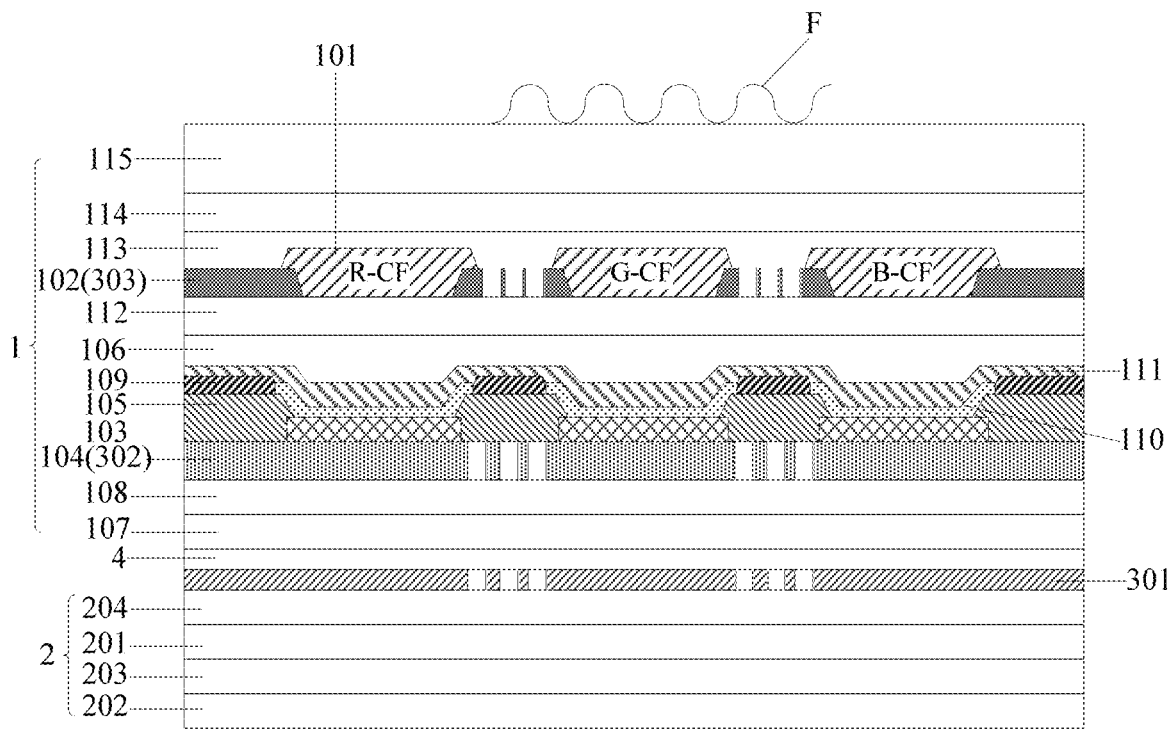
FIG. 5 is a schematic diagram of a sectional structure along a III-IV line of FIG. 4.
Figure 6:
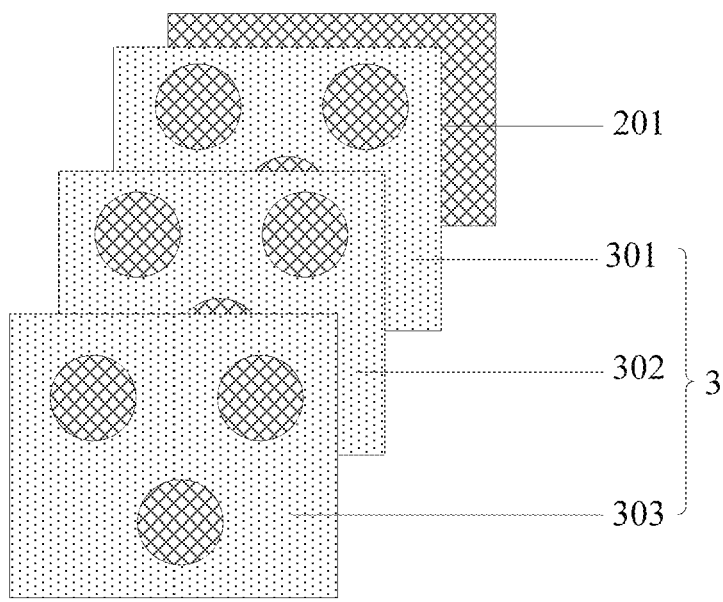
FIG. 6 is a drawing of a corresponding relation of light transmitting holes of a collimating structure and fingerprint recognition elements in FIG. 4.
Figure 7:
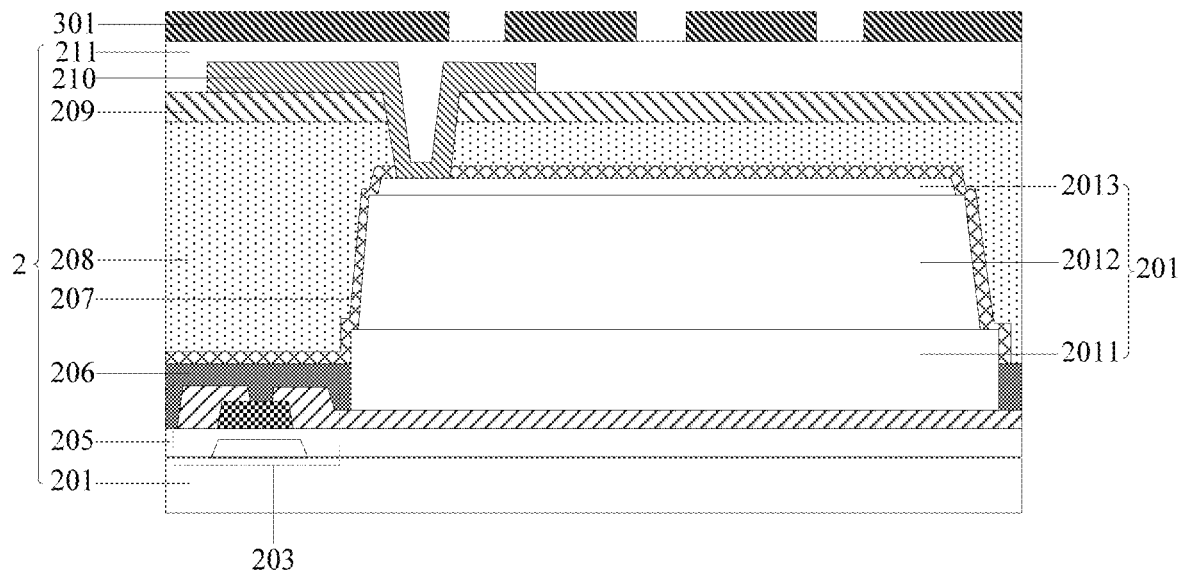
FIG. 7 is a schematic structural diagram of a fingerprint recognition region in a fingerprint recognition circuit provided by an embodiment of the present disclosure.

Besides, each of the fingerprint recognition elements 201 may correspond to at least one sleeve hole structure, e.g., several or even hundreds of sleeve hole structures. In some embodiments, FIG. 1 to FIG. 3 show that one fingerprint recognition element 201 corresponds to one sleeve hole structure, and FIG. 5 to FIG. 6 show that one fingerprint recognition element 201 corresponds to three sleeve hole structures. In some embodiments, shapes of the light transmitting holes may be circular or square, which is not defined herein. Moreover, the display apparatus provided by the embodiment of the present disclosure is not limited to a structure with two or three light shading layers, and the number of the light shading layers may be further increased, e.g., four light shading layers or more, which is not described in detail herein.

In some embodiments, in the display apparatus provided by the embodiment of the present disclosure, the collimating structure 3 may have the following five possible implementations.

The first possible implementation: as shown in FIG. 2 and FIG. 5, the display module 1 may further include: a plurality of anodes 103, and a flat layer 104 on a side of a layer with the plurality of anodes 103 away from the black matrix 102; and the collimating structure 3 may include: a first light shading layer 301 with a plurality of first light transmitting holes, a second light shading layer 302 with a plurality of second light transmitting holes, and a third light shading layer 303 with a plurality of third light transmitting holes;

wherein the first light shading layer 301 may be on a side of the fingerprint recognition circuit 2 facing the display module 1, the second light shading layer 302 may be multiplexed as the flat layer 104, and the third light shading layer 303 may be multiplexed as the black matrix 102.

When the first light shading layer 301 is on a side of the fingerprint recognition circuit 2 facing the display module 1, the first light shading layer 301 may be fabricated on the fingerprint recognition circuit 2 after fabrication of the fingerprint recognition circuit 2 is finished, so that a fabrication process of an existing fingerprint recognition circuit 2 does not need to change, and the compatibility is good. Besides, the second light shading layer 302 is multiplexed as the flat layer 104, the whole thickness of the display apparatus is reduced, the fabrication process is simplified, and the production efficiency is improved.

Figure 8:
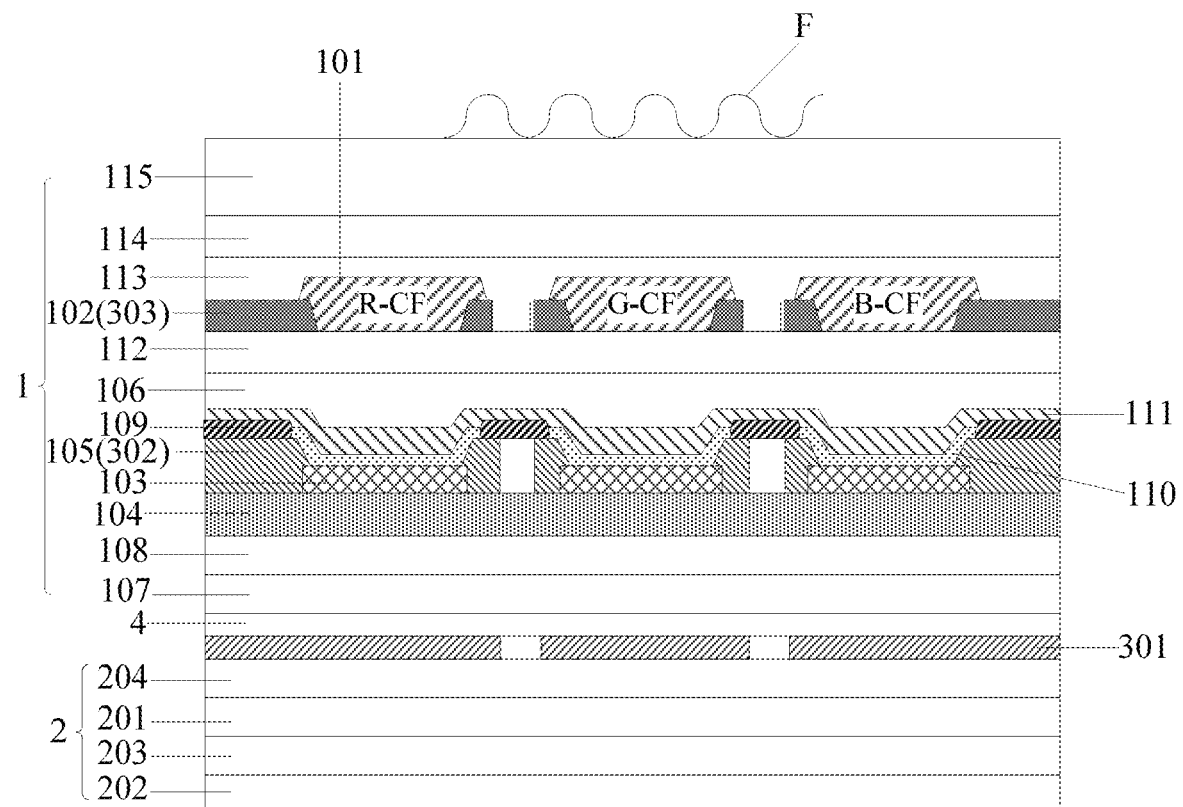
FIG. 8 is another schematic diagram of a sectional structure along a I-II line of FIG. 1.

The second possible implementation: as shown in FIG. 8, the display module 1 may further include: a plurality of anodes 103, and a pixel defining layer 105 on a side of a layer with the plurality of anodes 103 facing the black matrix 102; and the collimating structure 3 may include: a first light shading layer 301 with a plurality of first light transmitting holes, a second light shading layer 302 with a plurality of second light transmitting holes, and a third light shading layer 303 with a plurality of third light transmitting holes; wherein the first light shading layer 301 is on a side of the fingerprint recognition circuit 2 facing the display module 1, the second light shading layer may be multiplexed as the pixel defining layer 105, and the third light shading layer 303 may be multiplexed as the black matrix 102.

Based on the same reason of the first possible implementation, the second possible implementation is well compatible with the fabrication process of the fingerprint recognition circuit, thus the whole thickness of the display apparatus may be reduced, the fabrication process is simplified, and the production efficiency is high.

Figure 9:
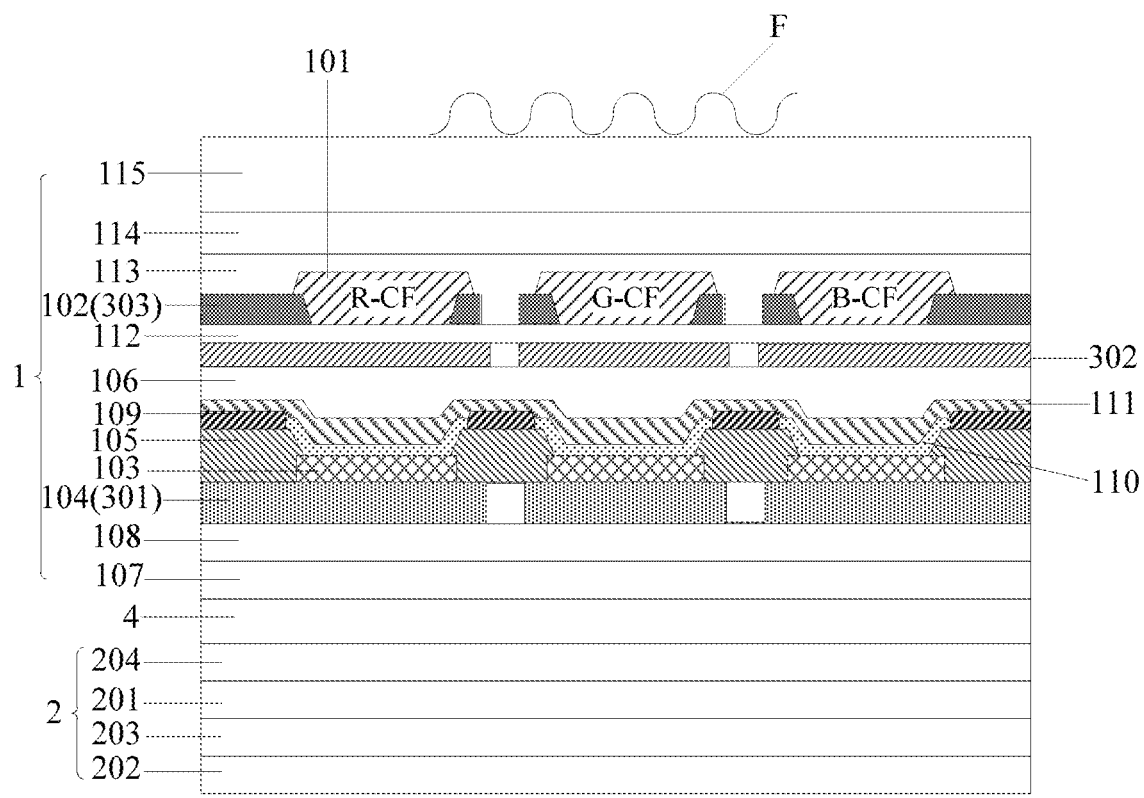
FIG. 9 is another schematic diagram of a sectional structure along a I-II line of FIG. 1.

The third possible implementation: as shown in FIG. 9, the display module 1 may further include: a plurality of anodes 103, a flat layer 104 on a side of a layer with the plurality of anodes 103 away from the black matrix 102, and an encapsulation layer 106 between the plurality of anodes 103 and the black matrix 102; and the collimating structure 3 may include: a first light shading layer 301 with a plurality of first light transmitting holes, a second light shading layer 302 with a plurality of second light transmitting holes, and a third light shading layer 303 with a plurality of third light transmitting holes; wherein the first light shading layer 301 may be multiplexed as the flat layer 104, the second light shading layer 302 may be on a side of the encapsulation layer 106 facing the black matrix 102, and the third light shading layer 303 may be multiplexed as the black matrix 102.

Generally, the encapsulation layer 106 may include a first inorganic layer, an organic layer and a second inorganic layer which are sequentially stacked, wherein the second inorganic layer is closest to a position of a film layer where the black matrix 102 located, and in the present disclosure, the second light shading layer 302 is further on a side of the second inorganic layer away from the organic layer.

Figure 10:
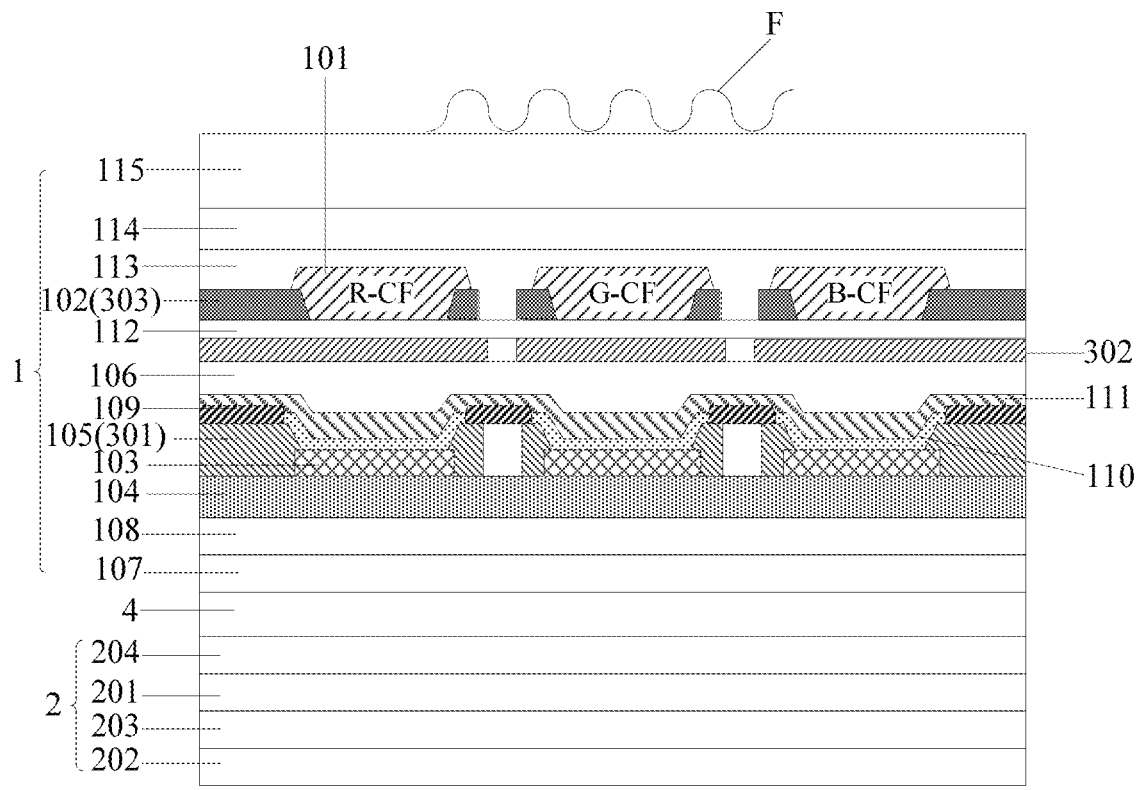
FIG. 10 is another schematic diagram of a sectional structure along a I-II line of FIG. 1.

The fourth possible implementation: as shown in FIG. 10, the display module 1 may further include: a plurality of anodes 103, a pixel defining layer 105 on a side of a layer with the plurality of anodes 103 facing the black matrix 102, and an encapsulation layer 106 between the pixel defining layer 105 and the black matrix 102; and the collimating structure 3 may include: a first light shading layer 301 with a plurality of first light transmitting holes, a second light shading layer 302 with a plurality of second light transmitting holes, and a third light shading layer 303 with a plurality of third light transmitting holes; wherein the first light shading layer 301 may be multiplexed as the pixel defining layer 105, the second light shading layer 302 may be on a side of the encapsulation layer 106 facing the black matrix 102, and the third light shading layer 303 may be multiplexed as the black matrix 102.

Figure 11:
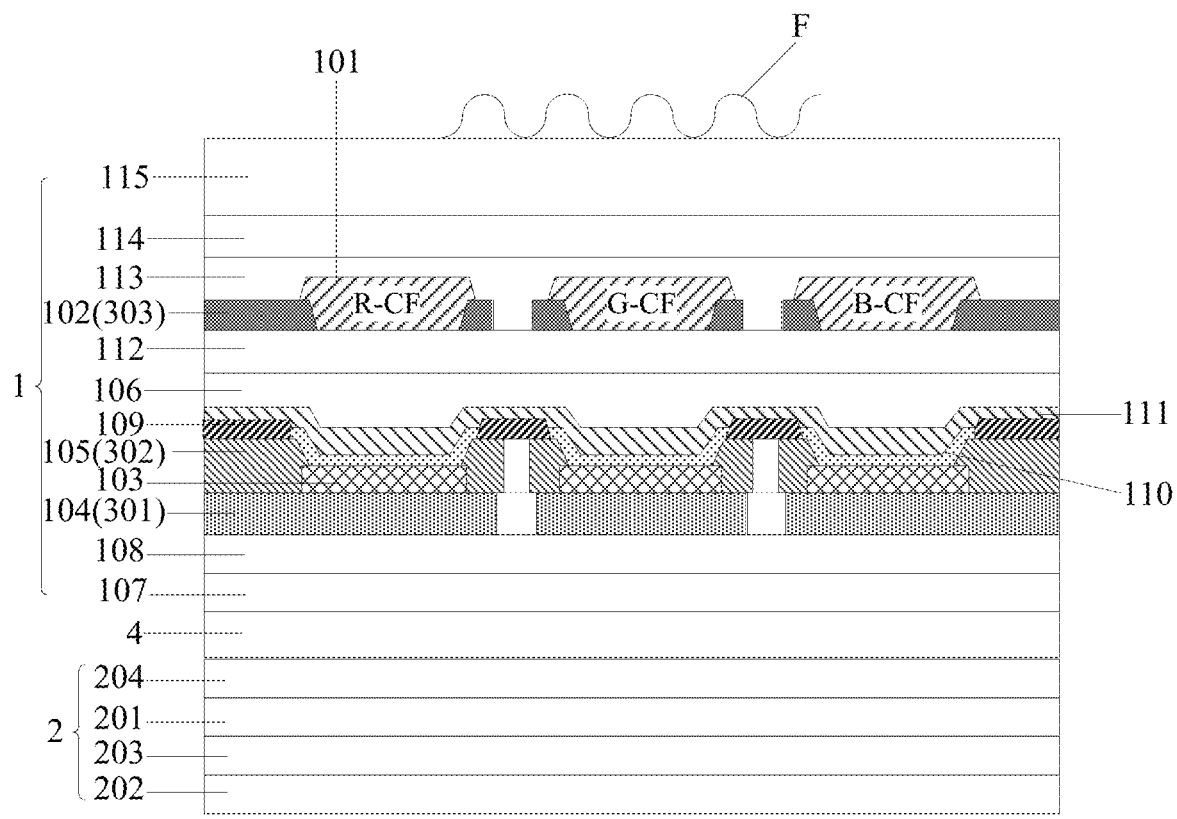
FIG. 11 is another schematic diagram of a sectional structure along a I-II line of FIG. 1.

The fifth possible implementation: as shown in FIG. 11, the display module 1 may further include: a plurality of anodes 103, a flat layer 104 on a side of a layer with the plurality of anodes 103 away from the black matrix 102, and a pixel defining layer 105 on a side of the layer with the plurality of anodes 103 facing the black matrix 102; and the collimating structure 3 may include: a first light shading layer 301 with a plurality of first light transmitting holes, a second light shading layer 302 with a plurality of second light transmitting holes, and a third light shading layer 303 with a plurality of third light transmitting holes; wherein the first light shading layer 301 may be multiplexed as the flat layer 104, the second light shading layer 302 may be multiplexed as the pixel defining layer 105, and the third light shading layer 303 may be multiplexed as the black matrix 102.

In the above third to fifth possible implementations, all the light shading layers of the collimating structure 3 are integrated in the display module 1, attachment alignment between the different light shading layers is avoided, thus the possible unfavorable influence of the attachment alignment accuracy on a collimating effect is avoided, and the accuracy of fingerprint recognition is improved.

Figure 12:
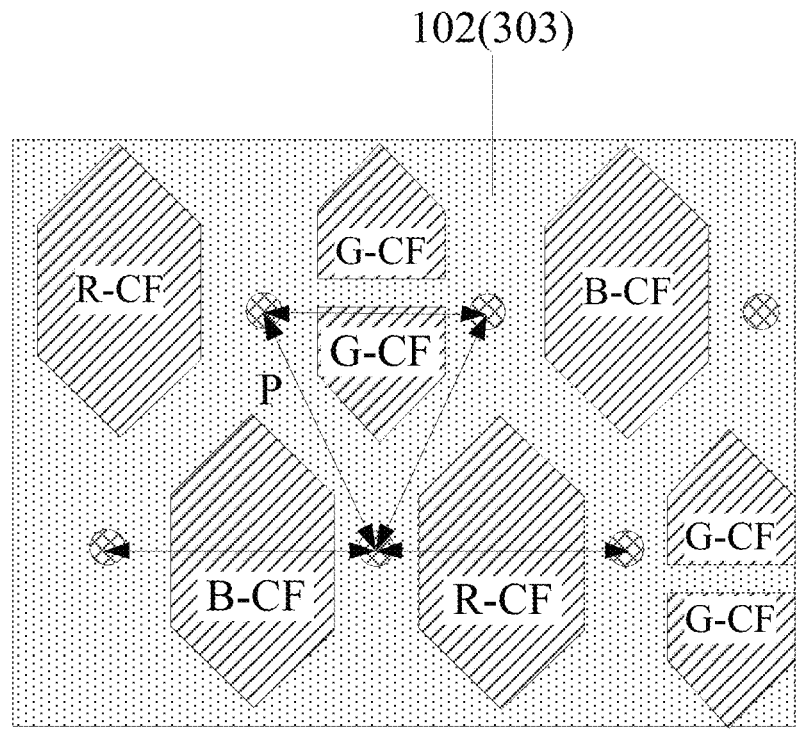
FIG. 12 is a schematic structural diagram of a third light shading layer provided by an embodiment of the present disclosure.
Figure 13:
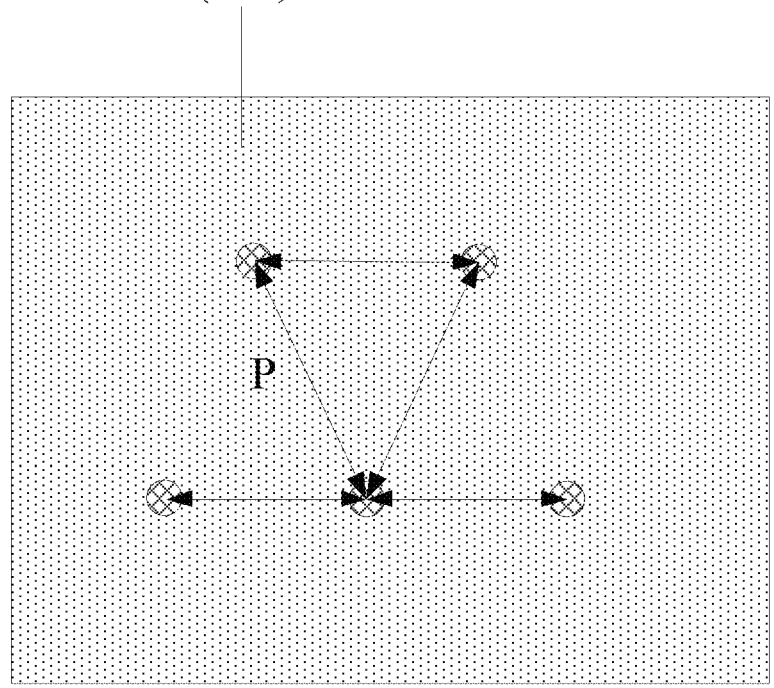
FIG. 13 is a schematic structural diagram of a first light shading layer and a second light shading layer provided by an embodiment of the present disclosure.

In some embodiments, in the display apparatus provided by the embodiment of the present disclosure, in order to improve the collimating effect, centers of orthographic projections of the first light transmitting holes, the second light transmitting holes and the third light transmitting holes in one-to-one correspondence on the plane where the display module 1 is located coincide, and distances P between centers of any two adjacent first light transmitting holes are the same (as shown in FIG. 12 and FIG. 13). According to the process fabrication capability, a value of P may be within a range of 20 μm-80 μm.

In some embodiments, in the display apparatus provided by the embodiment of the present disclosure, a bore diameter $d_1$ of the first light transmitting holes may be equal to a bore diameter $d_3$ of the third light transmitting holes, so that the required collimating light-collection angle θ is guaranteed.

Figure 14:
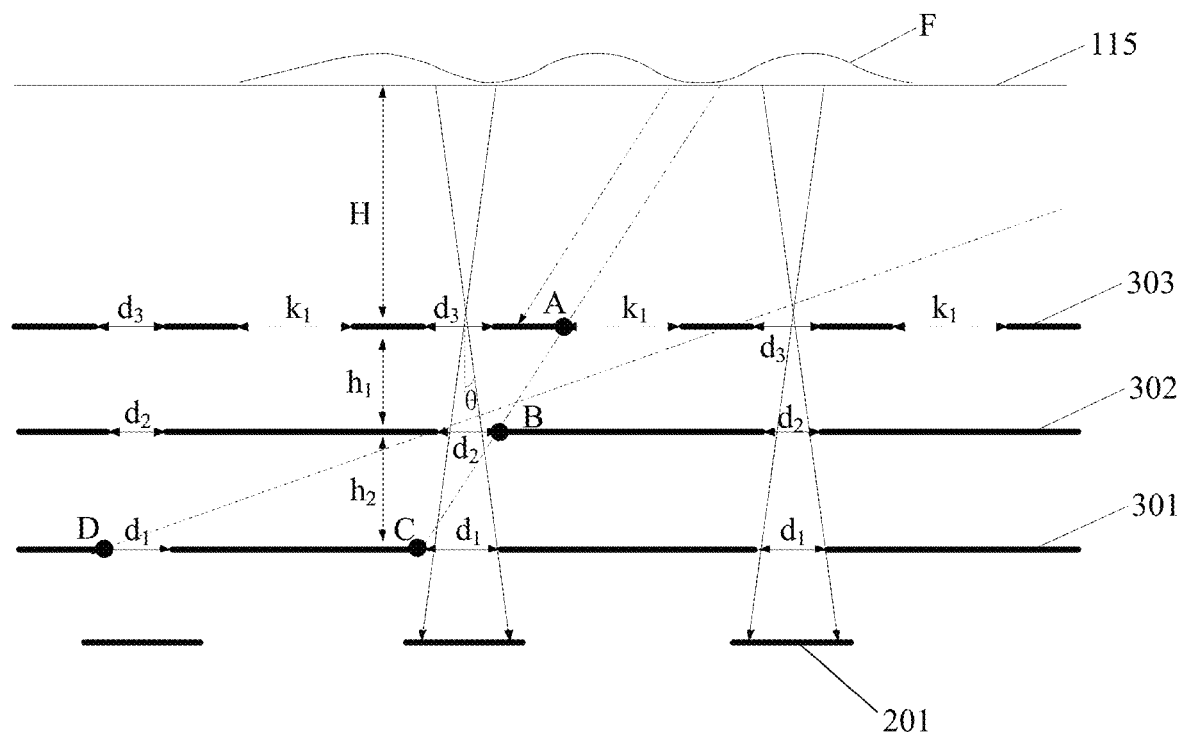
FIG. 14 is a design principle drawing of fingerprint imaging and crosstalk prevention provided by an embodiment of the present disclosure.

In some embodiments, as shown in FIG. 14, a distance between the third light shading layer 303 and the display surface is H, a value of which is within a range of 100 μm-1000 μm, e.g., 100 μm, 200 μm, 300 μm, 400 μm, 500 μm, 600 μm, 700 μm, 800 μm, 900 μm, 1000 μm, etc. A distance between the second light shading layer 302 and the third light shading layer 303 is $h_1$, and a distance between the second light shading layer 302 and the first light shading layer 301 is $h_2$. According to the process fabrication capability and in order to guarantee that the display apparatus is light and thin, a value of $h_1$ may be within a range of 1 μm-to 30 μm, e.g., 1 μm, 5 μm, 10 μm, 15 μm, 20 μm, 25 μm, 30 μm, etc. a value of $h_2$ may be within a range of 2 μm to 100 μm, e.g., 1 μm, 10 μm, 20 μm, 30 μm, 40 μm, 50 μm, 60 μm, 70 μm, 80 μm, 90 μm, 100 μm, etc. The collimating light-collection angle θ meets the following relation: $\tan θ=d_1/(h_1+h_2)$.

According to the process fabrication capability and in order to guarantee that the modules are light and thin, a value of $d_1$ may be within a range of 4 μm to 15 μm, e.g., 4 μm, 5 μm, 6 μm, 7 μm, 8 μm, 9 μm, 10 μm, 11 μm, 12 μm, 13 μm, 14 μm, 15 μm, etc., and during specific implementation, fingerprint reflected light rays with the collimating light-collection angle θ in a range being about 10° to 30° are selected for imaging.

Besides, interference of stray light, e.g., stray light 1 and stray light 2, must be avoided in order to realize a collimating function, which must requires reasonable control over $d_1$, $d_2$, $d_3$, P, $h_1$ and $h_2$. How to avoid interference of the stray light will be described in detail below.

In some embodiments, the bore diameter $d_2$ of the second light transmitting holes may be changed through optical design, so that the stray light 1 may not reach the fingerprint recognition element 201, that is, three points A, B and C marked in the FIG. 14 are connected in a line, wherein the point A is a left boundary point of the first opening for arranging a green color filter (G-CF), the point B is a right boundary point of the second light transmitting hole, and the point C is a left boundary point of the first light transmitting hole. At the moment, all parameters need to meet the following relation:

$$d_1 = d_3 \quad (1)$$

$$d_2/d_3 = h_1/(h_1 + h_2) \quad (2)$$

$$(P - D - d_1)/(2d_3) \geq h_1/h_2 \quad (3)$$

where D is a bore diameter of the first opening contained in the black matrix 102, and a value of D is within a range of 10 μm to 40 μm, e.g., 10 μm, 20 μm, 30 μm, 40 μm, etc.

Further, in order to prevent influence of light ray crosstalk of the adjacent third light transmitting holes (that is, guarantee that the stray light 2 in the FIG. 14 does not reach the point C), the following relation needs to be met:

$$(P - d_3 + d_2)/h_2 \geq (P + D + 3d_1 + d_2)/h_1 \quad (4).$$

Formulas (1) to (4) are combined so that the following relation may be obtained:

$$(h_1/h_2) \geq (P + D + 3d_1 + d_2)/(P - d_1 + d_2) \quad (5)$$

$$(P - D - d_1)/(2d_1) \geq (h_1/h_2) \quad (6).$$

Therefore, P, D, $d_1$, $d_2$, $h_1$ and $h_2$ meet the following relation:

$$(P - D - d_1)/(2d_1) \geq (h_1/h_2) \geq (P + D + 3d_1 + d_2)/(P - d_1 + d_2) \quad (7).$$

Figure 15:
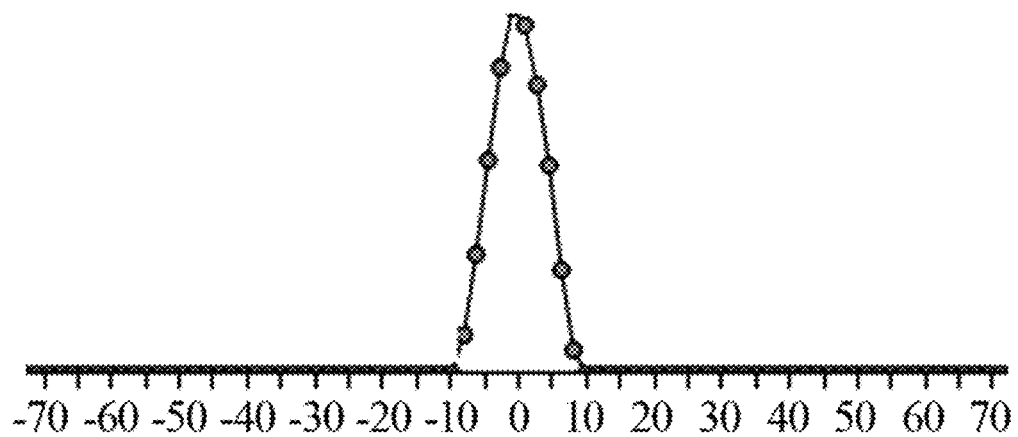
FIG. 15 is a drawing of simulation assessment of optical characteristics provided by an embodiment of the present disclosure.
Figure 16:
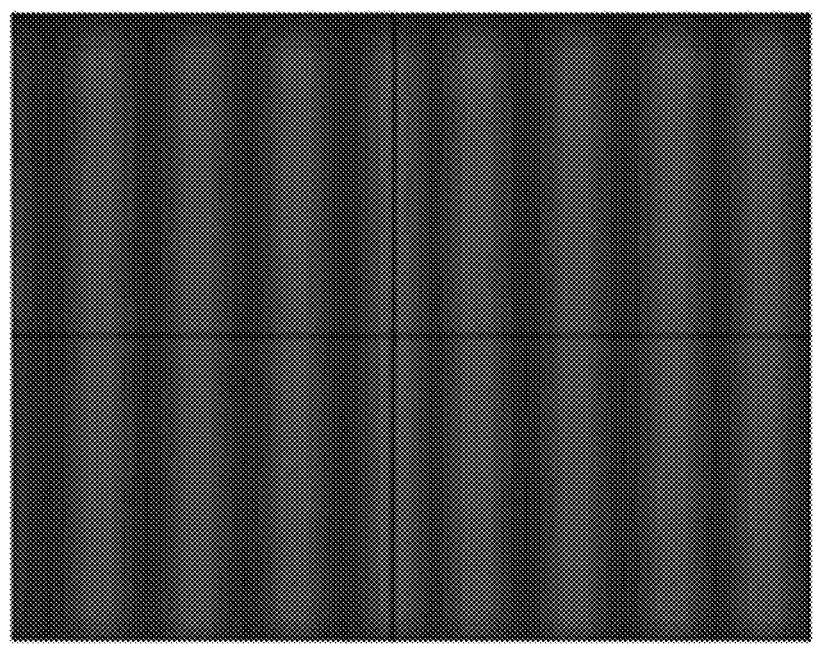
FIG. 16 is a drawing of simulation assessment of fingerprint imaging provided by an embodiment of the present disclosure.
Figure 16:

It can be sent from a drawing of optical simulation in FIG. 15 that the light transmitting holes in the three layers avoid interference of the stray light and only allow light rays with the collimating light-collection angle θ in a range of ±9° to pass. FIG. 16 is a drawing of simulation assessment of fingerprint imaging and may show that the light transmitting holes in three layers may screen out the small-angle light rays in an approximately collimating mode and make the small-angle light rays reach the fingerprint recognition elements below, each of the screened-out light rays may accurately correspond to the valleys and the ridges of a fingerprint one by one without crosstalk of other stray light, and thus accurate recognition may be achieved.

Besides, in the display apparatus provided by the embodiment of the present disclosure, as shown in FIG. 2, the display module 1 may generally further include: a first base substrate 107, a first driving circuit layer 108, a spacer layer 109, a light-emitting layer 110, a cathode 111, a buffer layer 112, a first protection layer 113, a touch layer 114 and a cover plate 115. As shown in FIG. 2 and FIG. 5, the fingerprint recognition circuit 2 may further include: a second base substrate 202, a second driving circuit layer 203, a second protection layer 204, a gate insulation layer 205, a passivation layer 206, a side wall protection layer 207, a resin layer 208, an insulation layer 209, a bias voltage line 210 and a third protection layer 211. Each of the fingerprint recognition elements 201 includes a first electrode 2011, a photoelectric conversion layer 2012 and a second electrode 2013 stacked. In some embodiments, the display module 1 and the fingerprint recognition circuit 2 are fixed with each other through an optical adhesive 4.

The display apparatus provided by the embodiment of the present disclosure includes: the display module with the plurality of color filters and the black matrix, wherein the black matrix is provided with the plurality of first openings and the plurality of second openings, and the plurality of color filters are provided in the plurality of first openings in a one-to-one correspondence; the fingerprint recognition circuit, on the side of the display module away from the display surface of the display module and including the plurality of fingerprint recognition elements, wherein the orthographic projection of each of the fingerprint recognition elements on the plane where the display module is located at least completely covers the orthographic projection of one of the second openings and does not overlap with the orthographic projections of the plurality of first openings; and the collimating structure, on the incident side of the fingerprint recognition circuit and including at least two light shading layers, wherein each of the light shading layers is provided with the plurality of light transmitting holes, the light transmitting holes in the respective light shading layers are in one-to-one correspondence, the orthographic projections of the light transmitting holes in one of the light shading layers on the plane where the display module is located at least overlap partially with the orthographic projections of the corresponding light transmitting holes in another of the light shading layers on the plane where the display module, respectively, and, and one of the light shading layers is multiplexed as the black matrix. During fingerprint recognition, when a finger touches the display surface of the display module, the corresponding light transmitting holes of each of the light shading layers may screen out small-angle light rays in an approximately collimating mode and make the small-angle light rays reach the fingerprint recognition elements below, the fingerprint recognition elements may detect the intensities of screened-out light rays, energies of downward diffuse reflection light rays of the valleys and the ridges differ, the light intensities detected by the plurality of fingerprint recognition elements differ, thus fingerprint information is obtained, and large-area fingerprint recognition is achieved. Besides, one of the light shading layers is multiplexed as the black matrix, the fabrication process of one light shading layer may be omitted, the fabrication process flow is simplified, the production cost is reduced, and the production efficiency is improved.

Apparently, those skilled in the art may make various changes and transformations for the present disclosure without departing from the spirit and scope of the present disclosure. In this case, if these changes and transformations of the present disclosure belong to the scope of claims and their equivalents, the present disclosure also intends to include these changes and transformations.

What is claimed is:

1. A display apparatus, comprising:
a display module, comprising a plurality of color filters and a black matrix; wherein the black matrix is provided with a plurality of first openings and a plurality of second openings, and the plurality of color filters are arranged in the plurality of first openings in a one-to-one correspondence;
a fingerprint recognition circuit, on a side of the display module away from a display surface of the display module and comprising a plurality of fingerprint recognition elements, wherein an orthographic projection of each of the plurality of fingerprint recognition elements on a plane where the display module is located at least completely covers an orthographic projection of one of the plurality of second openings and does not overlap with orthographic projections of the plurality of first openings; and
a collimating structure, on an incident side of the fingerprint recognition circuit and comprising at least two light shading layers, wherein each of the light shading layers has a plurality of light transmitting holes, the light transmitting holes in any one of the light shading layers correspond to the light transmitting holes in any other one of the light shading layers in a one-to-one correspondence, orthographic projections of the light transmitting holes in one of the light shading layers on the plane where the display module is located at least overlap partially with orthographic projections of the corresponding light transmitting holes in another of the light shading layers on the plane where the display module, respectively, and one of the light shading layers is multiplexed as the black matrix.

2. The display apparatus according to claim 1, wherein the display module further comprises: a plurality of anodes, and a flat layer on a side of a layer with the plurality of anodes away from the black matrix; and
the collimating structure comprises: a first light shading layer with a plurality of first light transmitting holes, a second light shading layer with a plurality of second light transmitting holes, and a third light shading layer with a plurality of third light transmitting holes; wherein the first light shading layer is on a side of the fingerprint recognition circuit facing the display module, the second light shading layer is multiplexed as the flat layer, and the third light shading layer is multiplexed as the black matrix.

3. The display apparatus according to claim 1, wherein the display module further comprises: a plurality of anodes, and a pixel defining layer on a side of a layer with the plurality of anodes facing the black matrix; and
the collimating structure comprises: a first light shading layer with a plurality of first light transmitting holes, a second light shading layer with a plurality of second light transmitting holes, and a third light shading layer with a plurality of third light transmitting holes; wherein the first light shading layer is on a side of the fingerprint recognition circuit facing the display module, the second light shading layer is multiplexed as the pixel defining layer, and the third light shading layer is multiplexed as the black matrix.

4. The display apparatus according to claim 1, wherein the display module further comprises: a plurality of anodes, a flat layer on a side of a layer with the plurality of anodes away from the black matrix, and an encapsulation layer between the plurality of anodes and the black matrix; and
the collimating structure comprises: a first light shading layer with a plurality of first light transmitting holes, a second light shading layer with a plurality of second light transmitting holes, and a third light shading layer with a plurality of third light transmitting holes; wherein the first light shading layer is multiplexed as the flat layer, the second light shading layer is on a side of the encapsulation layer facing the black matrix, and the third light shading layer is multiplexed as the black matrix.

5. The display apparatus according to claim 1, wherein the display module further comprises: a plurality of anodes, a pixel defining layer on a side of a layer with the plurality of the anodes facing the black matrix, and an encapsulation layer between the pixel defining layer and the black matrix; and
the collimating structure comprises: a first light shading layer with a plurality of first light transmitting holes, a second light shading layer with a plurality of second light transmitting holes, and a third light shading layer with a plurality of third light transmitting holes; wherein the first light shading layer is multiplexed as the pixel defining layer, the second light shading layer is on a side of the encapsulation layer facing the black matrix, and the third light shading layer is multiplexed as the black matrix.

6. The display apparatus according to claim 1, wherein the display module further comprises: a plurality of anodes, a flat layer on a side of a layer with the plurality of anodes away from the black matrix, and a pixel defining layer on a side of the layer with the plurality of anodes facing the black matrix; and
the collimating structure comprises: a first light shading layer with a plurality of first light transmitting holes, a second light shading layer with a plurality of second light transmitting holes, and a third light shading layer with a plurality of third light transmitting holes; wherein the first light shading layer is multiplexed as the flat layer, the second light shading layer is multiplexed as the pixel defining layer, and the third light shading layer is multiplexed as the black matrix.

7. The display apparatus according to claim 2, wherein centers of orthographic projections of the first light transmitting holes, the second light transmitting holes and the third light transmitting holes in one-to-one correspondence on the plane where the display module is located coincide with each other.

8. The display apparatus according to claim 3, wherein centers of orthographic projections of the first light transmitting holes, the second light transmitting holes and the third light transmitting holes in one-to-one correspondence on the plane where the display module is located coincide with each other.

9. The display apparatus according to claim 4, wherein centers of orthographic projections of the first light transmitting holes, the second light transmitting holes and the third light transmitting holes in one-to-one correspondence on the plane where the display module is located coincide with each other.

10. The display apparatus according to claim 5, wherein centers of orthographic projections of the first light transmitting holes, the second light transmitting holes and the third light transmitting holes in one-to-one correspondence on the plane where the display module is located coincide with each other.

11. The display apparatus according to claim 6, wherein centers of orthographic projections of the first light transmitting holes, the second light transmitting holes and the third light transmitting holes in one-to-one correspondence on the plane where the display module is located coincide with each other.

12. The display apparatus according to claim 7, wherein distances between centers of any two adjacent first light transmitting holes of the plurality of first light transmitting holes are the same.

13. The display apparatus according to claim 8, wherein distances between centers of any two adjacent first light transmitting holes of the plurality of first light transmitting holes are the same.

14. The display apparatus according to claim 9, wherein distances between centers of any two adjacent first light transmitting holes of the plurality of first light transmitting holes are the same.

15. The display apparatus according to claim 10, wherein distances between centers of any two adjacent first light transmitting holes of the plurality of first light transmitting holes are the same.

16. The display apparatus according to claim 12, wherein a bore diameter of the first light transmitting holes is equal to that of the third light transmitting holes.

17. The display apparatus according to claim 16, wherein the bore diameter di of the first light transmitting holes and a bore diameter $d_2$ of the second light transmitting holes meet a following relation: d2/di=hi/(hi+h2), wherein hi is a distance between the second light shading layer and the third light shading layer, and $h_2$ is a distance between the first light shading layer and the second light shading layer.

18. The display apparatus according to claim 17, wherein a distance P between centers of the any two adjacent first light transmitting holes, a bore diameter D of the first openings, $d_1$, $d_2$, $h_1$ and $h_2$ meet a following relation: $(P-D-d_1)/(2d_1) \geq (h_1/h_2) \geq (P+D+3d_1+d_2)/(P-d_1+d_2)$.

19. The display apparatus according to claim 18, wherein a value of P is within a range of 1 μm to 80 μm, a value of D is within a range of 10 μm to 40 μm, a value of $d_1$ is within a range of 4 μm to 15 μm, a value of $d_2$ is within a range of 2 μm to 10 μm, a value of $h_1$ is within a range of 1 μm to 30 μm, and a value of $h_2$ is within a range of 2 μm to 100 μm.

20. The display apparatus according to claim 17, wherein a collimating light-collection angle θ determined by the first light shading layer and the third light shading layer meets a following relation: $\tan\theta = d_1/(h_1+h_2)$.

* * * * *